United States Patent
Subramanian et al.

(10) Patent No.: US 7,109,046 B1
(45) Date of Patent: Sep. 19, 2006

(54) SURFACE OXIDE TABULATION AND PHOTO PROCESS CONTROL AND COST SAVINGS

(75) Inventors: Ramkumar Subramanian, Sunnyvale, CA (US); Bhanwar Singh, Morgan Hills, CA (US); Khoi A. Phan, Santa Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 76 days.

(21) Appl. No.: 10/768,514

(22) Filed: Jan. 30, 2004

(51) Int. Cl.
*H01L 21/00* (2006.01)

(52) U.S. Cl. .................................. 438/5; 257/E21.526

(58) Field of Classification Search ...................... 438/5
See application file for complete search history.

(56) References Cited

U.S. PATENT DOCUMENTS

| | | | |
|---|---|---|---|
| 6,087,229 A * | 7/2000 | Aronowitz et al. | 438/287 |
| 6,563,578 B1 * | 5/2003 | Halliyal et al. | 356/237.4 |
| 6,593,748 B1 * | 7/2003 | Halliyal et al. | 324/455 |
| 6,642,066 B1 * | 11/2003 | Halliyal et al. | 438/16 |
| 6,810,296 B1 * | 10/2004 | Bode et al. | 700/110 |
| 6,908,774 B1 * | 6/2005 | Ghyselen et al. | 438/14 |
| 2004/0121085 A1 * | 6/2004 | Wang et al. | 427/569 |
| 2005/0032250 A1 * | 2/2005 | Mui et al. | 438/14 |
| 2005/0082482 A1 * | 4/2005 | Ludviksson | 250/342 |

* cited by examiner

*Primary Examiner*—W. David Coleman
(74) *Attorney, Agent, or Firm*—Amin & Turocy, LLP

(57) ABSTRACT

The present invention relates generally to semiconductor processing, and more particularly to methods and systems for reducing costs of wafer production by analyzing key aspects of wafer status to determine whether to initiate corrective measures to salvage a wafer at an early stage and before substantial costs are incurred in fabricating a defective wafer. One aspect of the present invention provides for growing an oxide layer on a wafer upon a determination that an oxide layer on the wafer surface is absent or is present but inadequate. Another aspect of the present invention provides for a determination of whether to apply preemptory corrective treatment(s) to a wafer surface based on the presence and/or magnitude of nitrogen signatures in an extant oxide surface layer, which can indicate that an undesirable defect known as "footing" will occur during a post-exposure delay period. Thus, the invention advantageously reduces production costs by facilitating a most correct decision to mitigate the source(s) of potential defects at an early stage and, thus, before substantial costs are incurred in production of the wafer.

33 Claims, 12 Drawing Sheets

(CROSS-SECTION)

(TOP-DOWN)

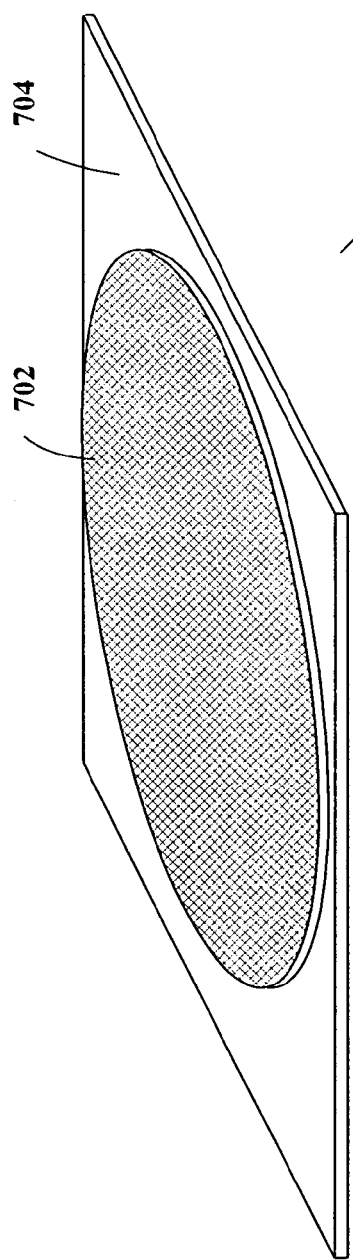
FIG. 7
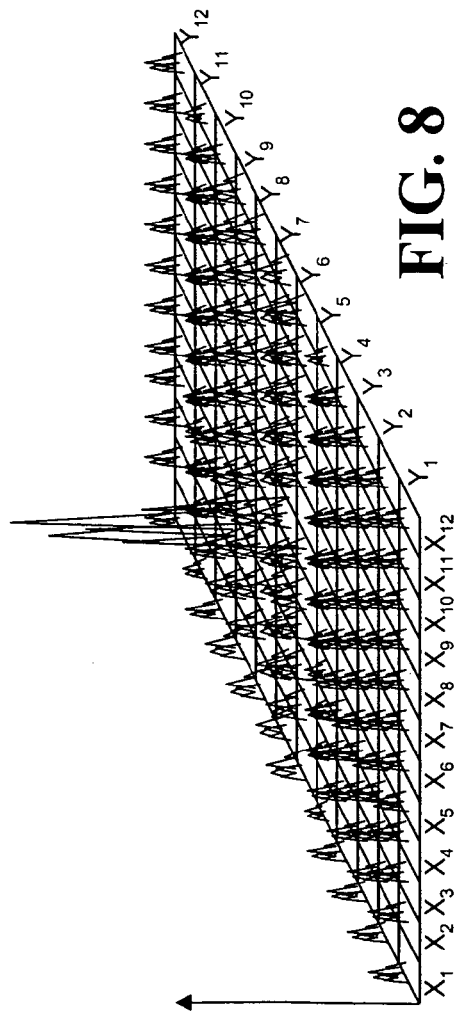
FIG. 9
FIG. 8

SURFACE OXIDE TABULATION AND PHOTO PROCESS CONTROL AND COST SAVINGS

TECHNICAL FIELD

The present invention relates generally to semiconductor manufacture, and more particularly to systems and methodologies that facilitate mitigation of resist footing and cost savings in wafer manufacture.

BACKGROUND OF THE INVENTION

As semiconductor trends continue toward decreased size and increased packaging density, every aspect of semiconductor fabrication processes is scrutinized in an attempt to maximize efficiency in semiconductor fabrication and throughput. Many factors contribute to fabrication of a semiconductor. For example, at least one photolithographic process can be used during fabrication of a semiconductor. This particular factor in the fabrication process is highly scrutinized by the semiconductor industry in order to improve packaging density and precision in semiconductor structure.

Lithography is a process in semiconductor fabrication that generally relates to transfer of patterns between media. More specifically, lithography refers to transfer of patterns onto a thin film that has been deposited onto a substrate. The transferred patterns then act as a blueprint for desired circuit components. Typically, various patterns are transferred to a photoresist (e.g., radiation-sensitive film), which overlies the thin film on the substrate during an imaging process described as "exposure" of the photoresist layer. During exposure, the photoresist is subjected to an illumination source (e.g. UV-light, electron beam, X-ray), which passes through a pattern template, or reticle, to print the desired pattern in the photoresist. Upon exposure to the illumination source, radiation-sensitive qualities of the photoresist permit a chemical transformation in exposed areas of the photoresist, which in turn alters the solubility of the photoresist in exposed areas relative to that of unexposed areas. When a particular solvent developer is applied, exposed areas of the photoresist are dissolved and removed, resulting in a three-dimensional pattern in the photoresist layer. This pattern is at least a portion of the semiconductor device that contributes to final function and structure of the device, or wafer.

Techniques, equipment and monitoring systems have concentrated on preventing and/or decreasing defect occurrence within lithography processes. For example, aspects of resist processes that are typically monitored can comprise: whether the correct mask has been used; whether resist film qualities are acceptable (e.g., whether resist is free from contamination, scratches, bubbles, striations, . . . ); whether image quality is adequate (e.g., good edge definition, line-width uniformity, and/or indications of bridging); whether critical dimensions are within specified tolerances; whether defect types and densities are recorded; and/or whether registration is within specified limits; etc. Such defect inspection task(s) have progressed into automated system(s) based on both automatic image processing and electrical signal processing.

Current methods of wafer fabrication can produce "footing," or "T-topping," as an undesirable side effect. Footing typically occurs during post-exposure delay (PED), which is the time between exposure and post-exposure bake (PEB). For example, ambient vapors having base compounds (e.g., amines, ammonia, etc.) can react with the photo-acids created during exposure. Once such ambient bases are absorbed into the surface of a resist, the acids are neutralized, resulting in a reduced solubility in the surface of the resist as compared to the rest of the resist. The less-soluble "skin" on the surface develops at a slower rate than the resist material between the surface and the substrate, resulting in the "T-top", or "foot" formation.

As lithographic techniques are pushed to their limits, smaller and smaller critical dimensions (CDs) are desired to maximize chip performance. Thus, chip manufacture is governed largely by wafer CD, which is defined as the smallest allowable width of, or space between, lines of circuitry in a semiconductor device. As methods of wafer manufacture are improved, wafer CD is decreased, which in turn requires finer and finer line edges to be produced. Specifically, footing represents a significant problem in the sub-0.25 µm range. As critical dimensions proceed below the sub-0.25 µm threshold, footing becomes increasingly detrimental to the performance of a finished chip. There is an unmet need in the art for systems and methods that facilitate early detection of conditions that can lead to footing, and compensatory measures that can mitigate the potential for footing, thereby reducing production costs and increasing quality and throughput.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for systems and methods that facilitate making a correct decision regarding continuing or augmenting processing of a wafer based on various monitored aspects of the wafer. Such aspects of the invention reduce costs associated with production of wafers via enhancing a decision model that can facilitate determining a point at which normal production of a wafer should not continue based on a defective aspect of the wafer, such that a determination can be made to augment production of the wafer and, thus, reduce overall production costs.

According to one aspect of the invention, various conditions of a wafer can be monitored during processing in a lithography track system. For example, an ellipsometry component can determine whether an oxide layer is present on the wafer. If the ellipsometry component determines that a sufficient oxide layer is present, then a decision can be made to continue processing the wafer. If an oxide layer is not sufficiently thick and/or absent at all or a portion of the wafer surface, then a decision can be made to augment production of the wafer by initiating corrective measures to repair the oxide layer.

According to another aspect of the invention, wafer conditions associated with a presence of nitrogen signatures can be monitored in situ. For example, the presence of surface nitrogen can indicate that the surface of the resist on the wafer will exhibit a lower solubility than the rest of the resist, which in turn can indicate an increased probability that footing will occur during post-exposure delay (PED). Such indications can assist in making a correct decision to augment production processes of the wafer by compensating for the nitrogen presence before further costs are incurred.

According to another aspect of the invention, if a nitrogen signature is detected on the resist surface, then a decision can be made to mitigate the nitrogen problem via, for example, an oxide plasma treatment. Such decision can be based on, for example, the amount of nitrogen present, the probability of successfully mitigating the effects of the detected nitrogen, the cost of repairing the resist surface, etc.

According to yet another aspect of the present invention, the determination of whether or not to take compensatory action during wafer production can be completely automated, such that a predefined set of parameters can delineate whether the automated system will approve or reject a wafer for further processing. This aspect of the invention can provide for various checks and/or human oversight in order to permit, for example, an override scenario, system parameter adjustment, etc., while production is in progress.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 7 is an illustration of a perspective view of a grid-mapped wafer according to one or more aspects of the present invention.

FIG. 8 is an illustration of plots of measurements taken at grid-mapped locations on a wafer in accordance with one or more aspects of the present invention.

FIG. 9 is an illustration of a table containing entries corresponding to measurements taken at respective grid-mapped locations on a wafer in accordance with one or more aspects of the present invention.

DETAILED DESCRIPTION OF THE INVENTION

Figure 1:
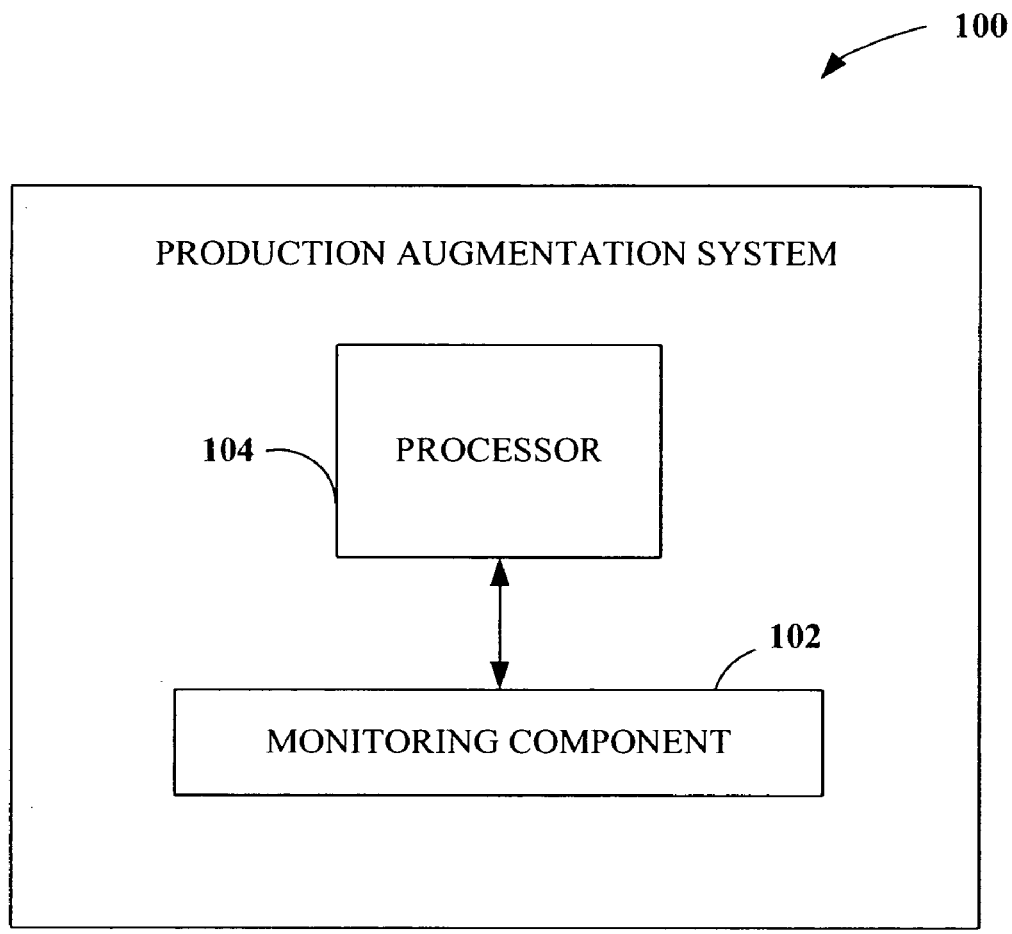
FIG. 1 is an illustration of a system that monitors wafer parameters to determine whether to augment wafer production in accordance with an aspect of the present invention.

The present invention will now be described with reference to the drawings, wherein like reference numerals are used to refer to like elements throughout. The present invention will be described with reference to systems and methods for monitoring wafers during production and reducing production costs by facilitating a correct decision regarding whether to proceed with normal production of a given wafer or to initiate corrective action(s) based on monitored conditions. It should be understood that the description of these exemplary aspects are merely illustrative and that they should not be taken in a limiting sense.

The term "component" refers to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function link networks) can be employed.

FIG. 1 is an illustration of a system 100 according to an aspect of the present invention, in which a monitoring component 102 is operably coupled to a processor 104. The monitoring component 102 can be, for example, an ellipsometry component. The present invention contemplates any suitable ellipsometry component and/or system, and such systems are intended to fall within the scope of the hereto-appended claims. Ellipsometry permits the thickness and/or optical constant(s) of organic thin films to be determined. Optical constants associated with organic thin films can include, for example, refractive index, extinction coefficient, etc. Ellipsometry can also monitor other characteristics of an organic thin layer, such as chemical composition, optical anisotropy, surface roughness, etc. Typically, ellipsometry measures intensity and phase of light projected onto a wafer. For example, an input beam can be directed to the surface of a wafer, where, upon hitting the wafer, part of the input beam is reflected and part is refracted through the surface layer of the wafer. Intensity ratios can then be calculated to indicate various characteristics of the monitored layer. Additionally, changes in polarization of the reflected light can be compared to the polarization of the input beam to determine a ratio related to phase information. Such phase information can be highly accurate and more sensitive than other systems, especially in the sub-10 nm range.

It is further to be appreciated that information gathered by the monitoring component 102 can be utilized for generating feedback and/or feed-forward data that can facilitate a determination of whether to perform corrective procedure(s) on a wafer. The system 100 can additionally employ such data to control components and/or operating parameters associated therewith. For instance, feedback/feed-forward information can be generated from sequence analysis to maintain, increase and/or decrease a rate at which fabrication processes (e.g., surface oxide treatment, . . . ) progresses. For example, one or more threshold parameters can be altered to affect a production rate based on sequence analysis data.

It is to be understood that a that the processor 104 can be a processor dedicated to determining whether and to what extent oxides and/or nitrides are present on a wafer, a processor used to control one or more of the components of the production augmentation system, or, alternatively, a processor that is both used to determine whether and to what extent oxides and/or nitrides are present on a wafer and to control one or more of the components of the production augmentation system.

The monitoring component 102 can scan a wafer in order to gather information regarding an oxide layer on the wafer. Such information can be utilized by the processor 104 to determine, for example, whether an oxide layer is present, and if so, whether the oxide layer is sufficiently uniform and/or thick. Typically, a thickness of at least 30 angstroms is desirable. Additionally, the monitoring component 102 can employ Fourier Transform Infrared Spectroscopy (FTIR) to scan an extant oxide layer to gather information germane to a determination of the presence of nitride signatures in the surface of the oxide layer. FTIR measures molecular bond vibration frequency in a sample. There are several frequencies at which a given molecular bond can vibrate: the lowest frequency is the ground state (G), and the higher frequencies are known as excited states (E). By exposing a molecular bond to infrared light, FTIR causes the bond to absorb light energy and become excited. The difference of the two energy states involved is always equal to the energy of the light absorbed. That is, $$E - G = \frac{hc}{\lambda}$$

where h is Planck's constant, the energy stored in a single photon ($6.626 \times 10^{-34}$ Joule-seconds), c is the speed of light (299,792, 458 meters/second), and $\lambda$ is the wavelength of the light absorbed. In this manner, FTIR can indicate which molecular bonds are present in the surface oxide layer and the identity of elements bonded thereby. The present invention can employ any spectroscopy system suitable to provide the desired functionality.

The processor 104 can then determine whether nitrogen signatures are present, the magnitude of such signatures, etc., which facilitates a correct decision as to whether or not corrective measures should be initiated to reduce overall production costs via early-stage avoidance of conditions indicative of a high footing potential. In this manner, the present invention can advantageously reduce production costs by gathering and analyzing information pertaining to wafer status in order to permit an educated decision to be made based on weighted factors for and/or against initiating corrective procedures on a given wafer. By avoiding a scenario wherein a wafer must be completely reworked, the present invention provides for increased cost savings.

Figure 2:
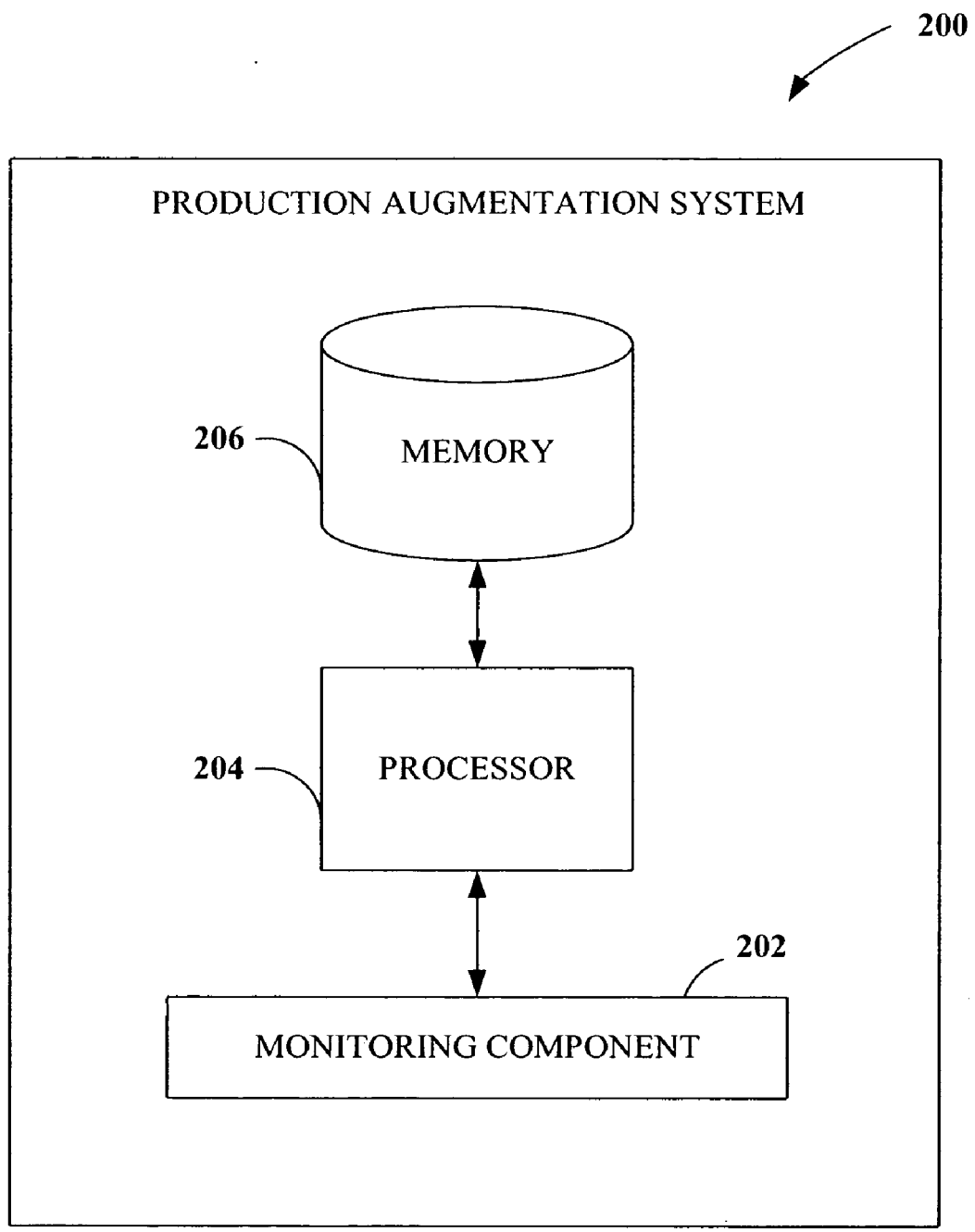
FIG. 2 is an illustration of a system that monitors wafer parameters to determine whether to augment wafer production in accordance with an aspect of the present invention.

FIG. 2 is an illustration of a system in accordance with an aspect of the present invention wherein a processor 204 is operably coupled to a monitoring component 202, and further is operably coupled to a memory component 206. The memory component 206 can be employed to retain information associated with, for example, the presence of an oxide layer, the thickness thereof, the presence of nitrides, tolerances associated with oxide and/or nitride presence, etc. Furthermore, the memory 206 can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 206 of the present systems and methods is intended to comprise, without being limited to, these and any other suitable types of memory.

Figure 3:
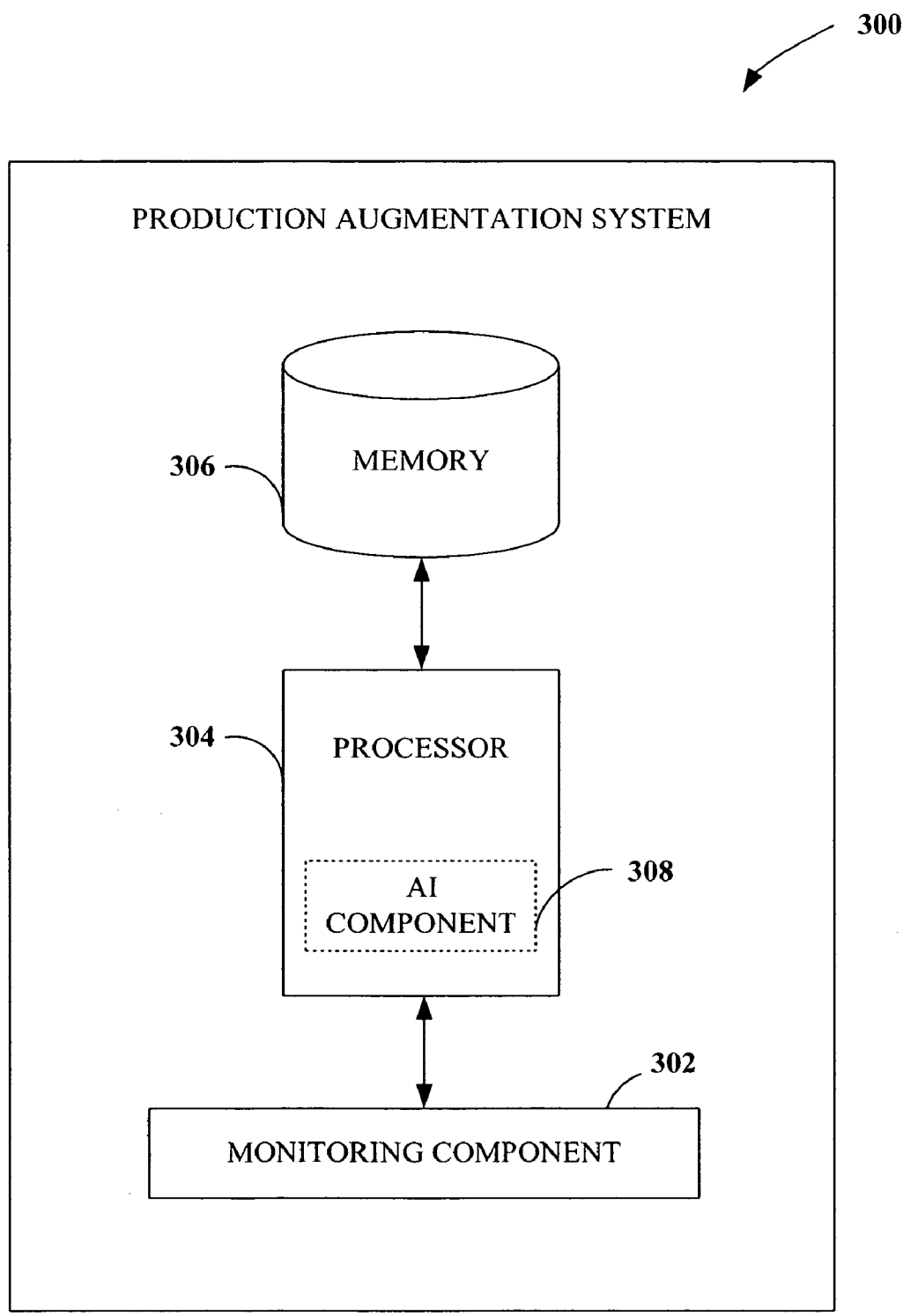
FIG. 3 is an illustration of a system that monitors wafer parameters to determine whether to augment wafer production in accordance with an aspect of the present invention.

FIG. 3 is an illustration of a system 300 in accordance with an aspect of the present invention. The system 300 can employ various inference schemes and/or techniques in connection with facilitating a determination of whether to augment production of a wafer by initiating corrective measures in order to reduce overall production costs. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 3, a monitoring component 302 is operably coupled to a processor 304, which in turn is operably coupled to a memory component 306. The processor 304 is further associated with an AI component 308 that can make inferences regarding whether a wafer requires corrective action to mitigate footing potential. For example, the AI component 308 can facilitate a determination of whether a surface oxide plasma treatment is required to mitigate the deleterious effects of any extant nitride presence in the resist surface, to what extent the surface treatment is required, whether the magnitude of the nitrogen presence is sufficient to warrant augmentation of the production process with respect to the wafer, etc. Such inferences can be based on, for instance, previous wafer measurements, success rates associated with surface treatment, predetermined threshold values delineating an acceptable amount of nitrogen presence in the resist surface, etc. Furthermore, the AI component 308 is operable to infer acceptable adjustments to such threshold values upon analysis of success and/or failure rates of various process parameters.

Figure 4:
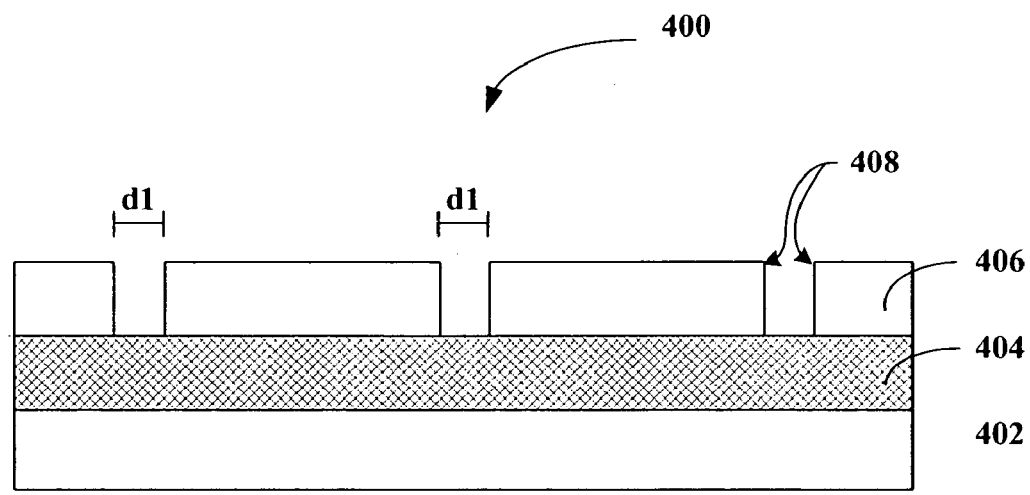
FIG. 4 is a cross-sectional and top-down illustration of a typical wafer exhibiting a desired target critical dimension.
Figure 4:
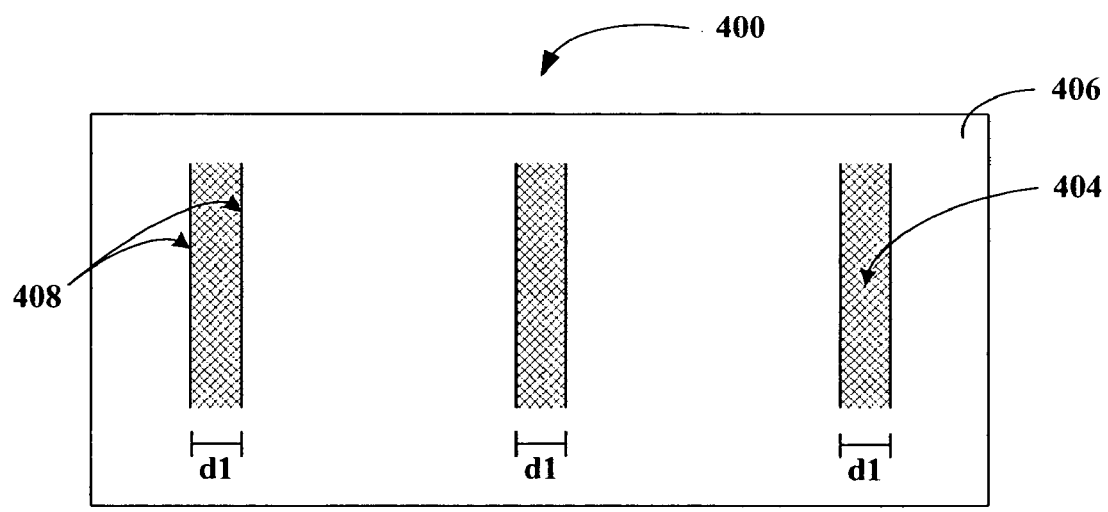

FIG. 4 illustrates a cross-sectional view of a wafer 400 with extant gate lines exhibiting a desired, or target, critical dimension (CD), d1, between gate lines. The wafer 400 comprises a silicon or polysilicon substrate 402, at least one layer of dielectric material 404 overlying the substrate 402, and a photoresist layer 406 overlying the at least one dielectric layer 404. The at least one dielectric layer can be, for example, a silicon carbonitride layer (SiCN), a silicon oxycarbide layer (SiOC:H), a silicon dioxide layer ($SiO_2$), and a silicon oxynitride layer (SiON). However, it is to be understood that the structure can comprise at least one dielectric layer and one or more dielectric layers, which may or may not be arranged in the order described above. The photoresist layer 406 can be, for example, a short wavelength photoresist layer that has been patterned with an image corresponding to a gate formation utilizing 193 nm or less radiation. An image can be patterned on the photoresist layer 406 utilizing short wavelength radiation, thereby exposing portions of the dielectric layer 404. Short wavelength radiation specifically comprises about 193 nm light and about 157 nm light or less. The image can, for example, correspond to one or more trenches and/or gates. The photoresist layer 406 has ideal gate lines 408 wherein no footing is present.

FIG. 4 also illustrates a top-down view of a wafer 400. Resist lines 408 are shown as having been formed utilizing a standard process wherein modern lithographic limits are approached. For example, the gate lines 408 can be formed via utilizing an ArF (153 nm) resist. The gates delineated by each pair of gate lines 408 have an associated CD described by the distance d1, where d1 is the target or desired width of the gates. The gate lines 408 further illustrate an ideal condition wherein no footing is observed. Such ideal condition is associated with an absence of nitrogen in the surface of the resist 406.

Figure 5:
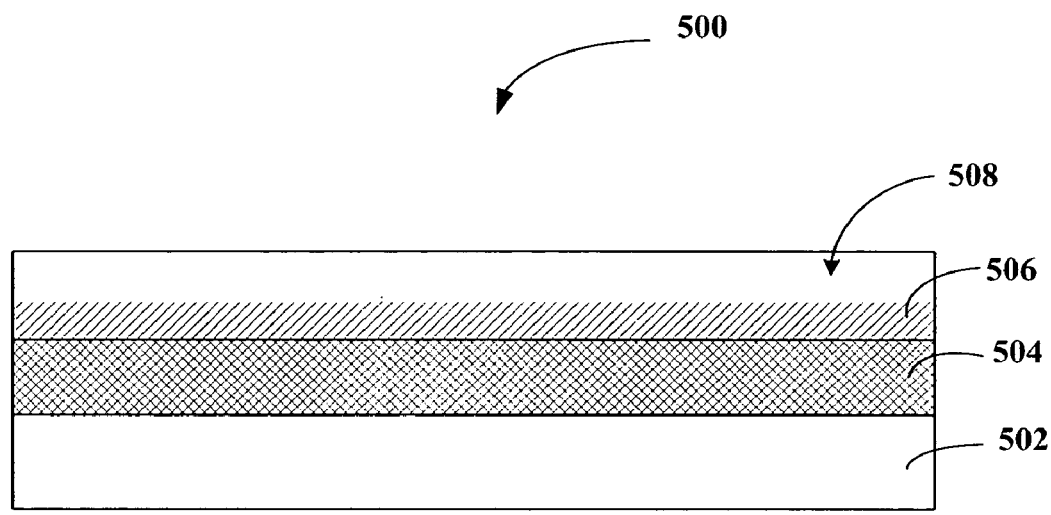
FIG. 5 is an illustration of a wafer prior to etching exhibiting nitride contamination on a resist surface.

FIG. 5 is an illustration of a wafer 500 similar to that of FIG. 4, wherein gate lines have not yet been formed. The wafer 500 comprises a silicon or polysilicon substrate 502, at least one layer of dielectric material 504 overlying the substrate 502, and a photoresist layer 506 overlying the at least one dielectric layer 504. The area 508 of the resist layer 506 represents the surface of the resist after exposure to some form of nitrogen, whether ambient vapors containing ammonia, nitride remnants of a processing solvent, etc. While the resist 506 is shown in FIG. 5 as leftward-hashed, the surface 508 of the resist is unhashed in order to illustrate that it is an integral but characteristically different portion of the resist 506. The surface 508 of the resist 506 typically comprises an oxide layer in which photo-acids are formed during exposure of the resist to UV radiation. The photo-acids formed in the resist effectively reduce the pH of the resist, and in doing so, increase the solubility of the resist. Upon exposure of the surface 508 of the resist 506 to nitrides, which are basic in nature, a chemical reaction occurs in which the acidic compounds in the resist surface react with the basic nitrides. Such reaction results in neutralization of the photo-acids, which causes a pH increase in the affected surface area 508 of the resist 506. The increase in surface pH creates a solubility gradient between the surface 508 and the underlying resist 506, wherein the surface 508 of the resist 506 is less soluble than the rest of the resist 506.

Figure 6:
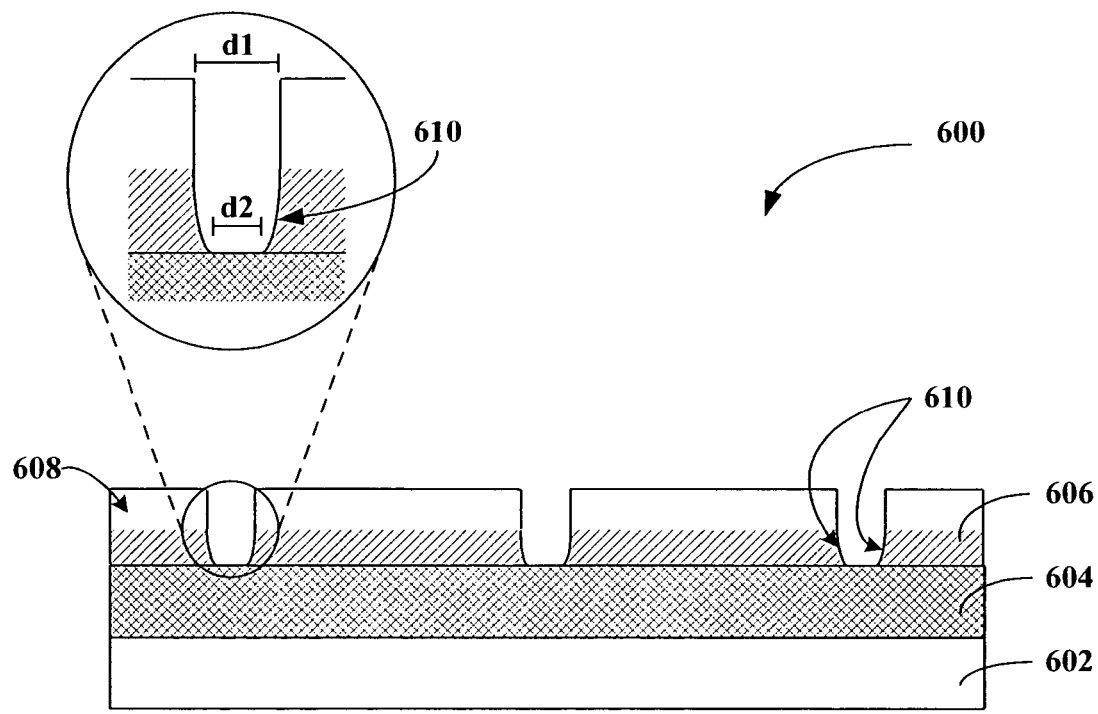
FIG. 6 is a cross-sectional and top-down illustration of a wafer exhibiting footing as a result of a solubility change in the surface of a resist.
Figure 6:
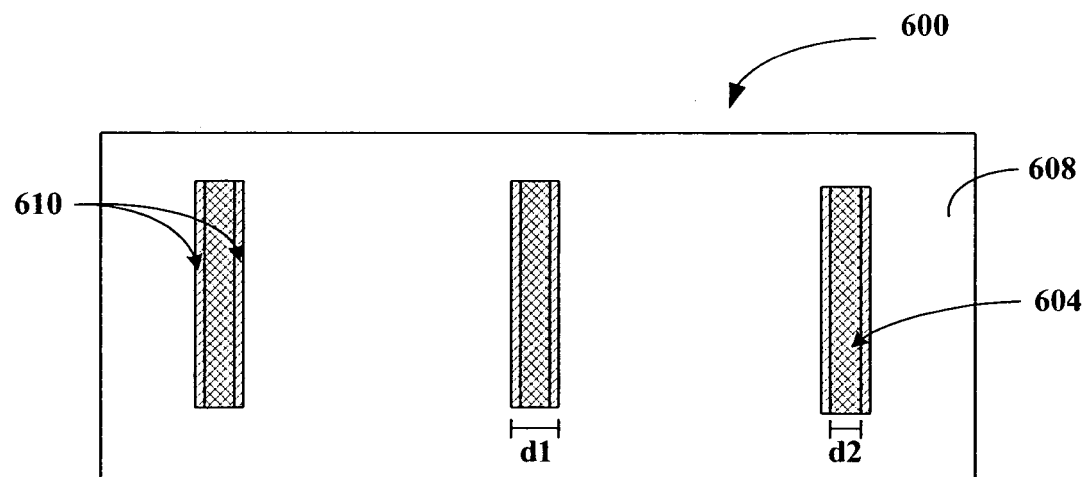

FIG. 6 is an illustration of a wafer 600 similar to those illustrated in FIGS. 4 and 5, wherein gate lines exhibit footing as a result of nitride contamination. The wafer 600 comprises a silicon or polysilicon substrate 602, at least one layer of dielectric material 604 overlying the substrate 602, and a photoresist layer 606 overlying the at least one dielectric layer 604. The area 608 of the resist layer 606 represents the surface of the resist after nitrogen contamination. The wafer 600 has existing gate lines formed therein and exhibiting footing 610 as a result of the nitride contamination of the surface 608 of the resist 606. During processing, a target CD, d1, can be achieved in the contaminated surface of the resist 608, but the solubility gradient between the surface 608 and the rest of the resist 606 can result in footing 610. As a result of the footing, the gates have a bottom critical dimension, d2, which substantially deviates from the target critical dimension d1.

FIG. 6 further illustrates a top-down view of the wafer 600, wherein the undesirable critical dimension d2 is again exhibited. In the top-down view, the at least one dielectric layer is exposed after gate lines have been created in a resist, the contaminated surface of which is labeled 608. The top-down view shows the occurrence of footing 610 at the edges of the gate lines, which effectively reduces the CD associated with gate width, resulting in the undesirable critical dimension d2.

FIG. 7 illustrates a perspective view of the steppable stage 704 supporting a wafer 702. The wafer 702 can be divided into a grid pattern as shown in FIG. 8. Each grid block (XY) of the grid pattern corresponds to a particular portion of the wafer 702 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess wafer-to-wafer and lot-to-lot variations. For example, a portion P (not shown) of a first wafer (not shown) can be compared to the corresponding portion P (not shown) of a second wafer. Thus, deviations between wafers and lots can be determined in order to calculate adjustments to the fabrication components that are necessary to accommodate for the wafer-to-wafer and/or lot-to-lot variations.

In FIG. 8, one or more respective portions of the wafer 702 ($X_1Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the wafer 702 and or one or more die located thereon can be mapped into any suitable number and/or arrangement of grid blocks to effect desired monitoring and control.

FIG. 9 is a representative table of concurrently measured critical dimensions and overlay taken at various portions of the wafer 702 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value ($V_A$) (e.g., no overlay error is indicated and/or overlay measurements and critical dimensions are within acceptable tolerances), while grid block $X_7Y_6$ has an undesired value ($V_U$) (e.g., overlay and critical dimensions are not within acceptable tolerances, thus at least an overlay or CD error exists). Thus, it has been determined that an undesirable fabrication condition exists at the portion of the wafer 702 mapped by grid block $X_7Y_6$. Accordingly, fabrication process components and parameters can be adjusted as described herein to adapt the fabrication process accordingly to mitigate the re-occurrence or exaggeration of this unacceptable condition.

Alternatively, a sufficient number of grid blocks can have desirable thickness measurements so that the single offensive grid block does not warrant scrapping the entire wafer. It is to be appreciated that fabrication process parameters can be adapted so as to maintain, increase, decrease and/or qualitatively change the fabrication of the respective portions of the wafer 702 as desired. For example, when the fabrication process has reached a pre-determined threshold level (e.g., X % of grid blocks have acceptable CDs and no overlay error exists), a fabrication step can be terminated.

Figure 10:
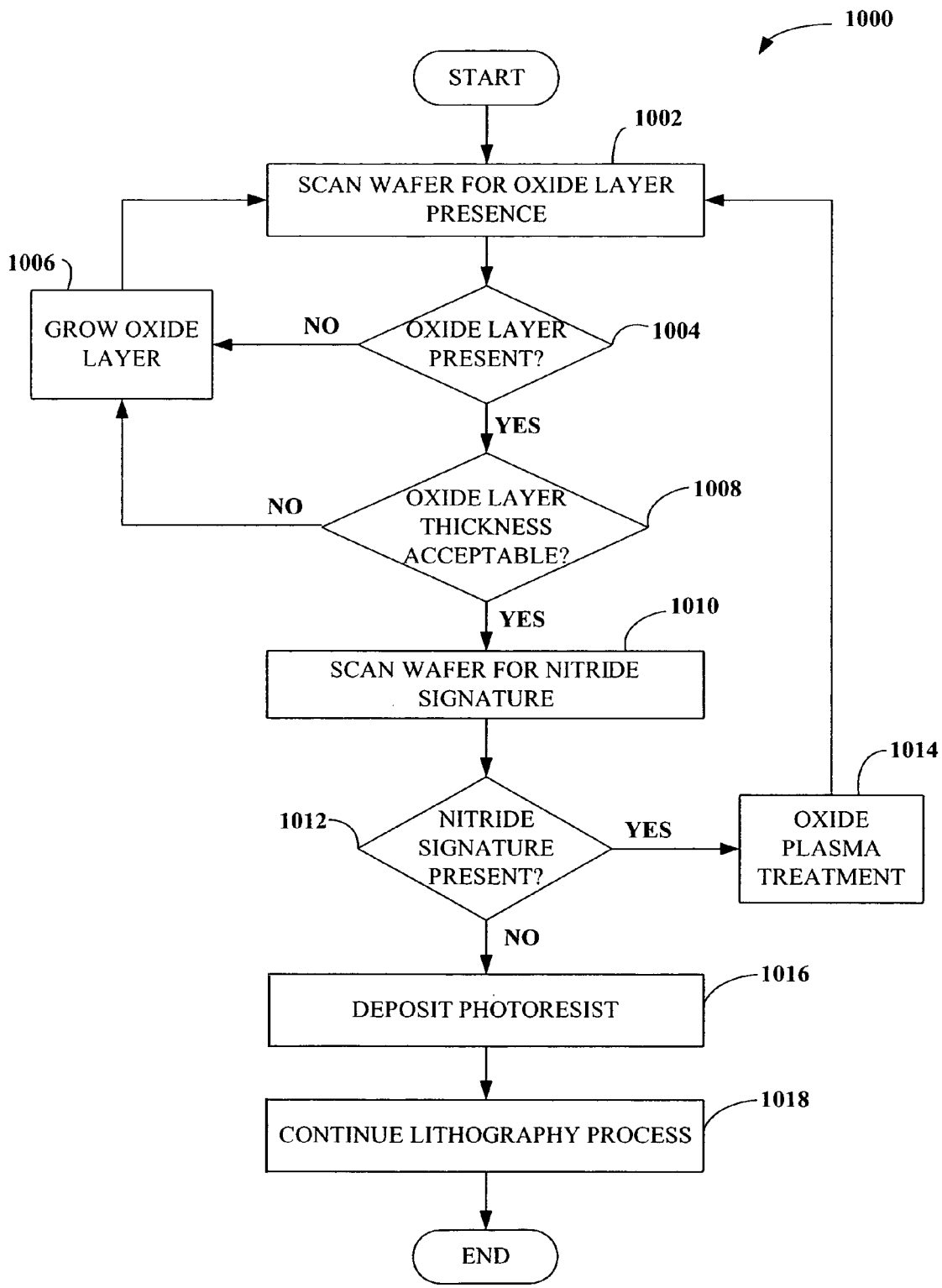
FIG. 10 is an illustration of a methodology that facilitates a correct determination regarding augmentation of production of a wafer.
Figure 11:
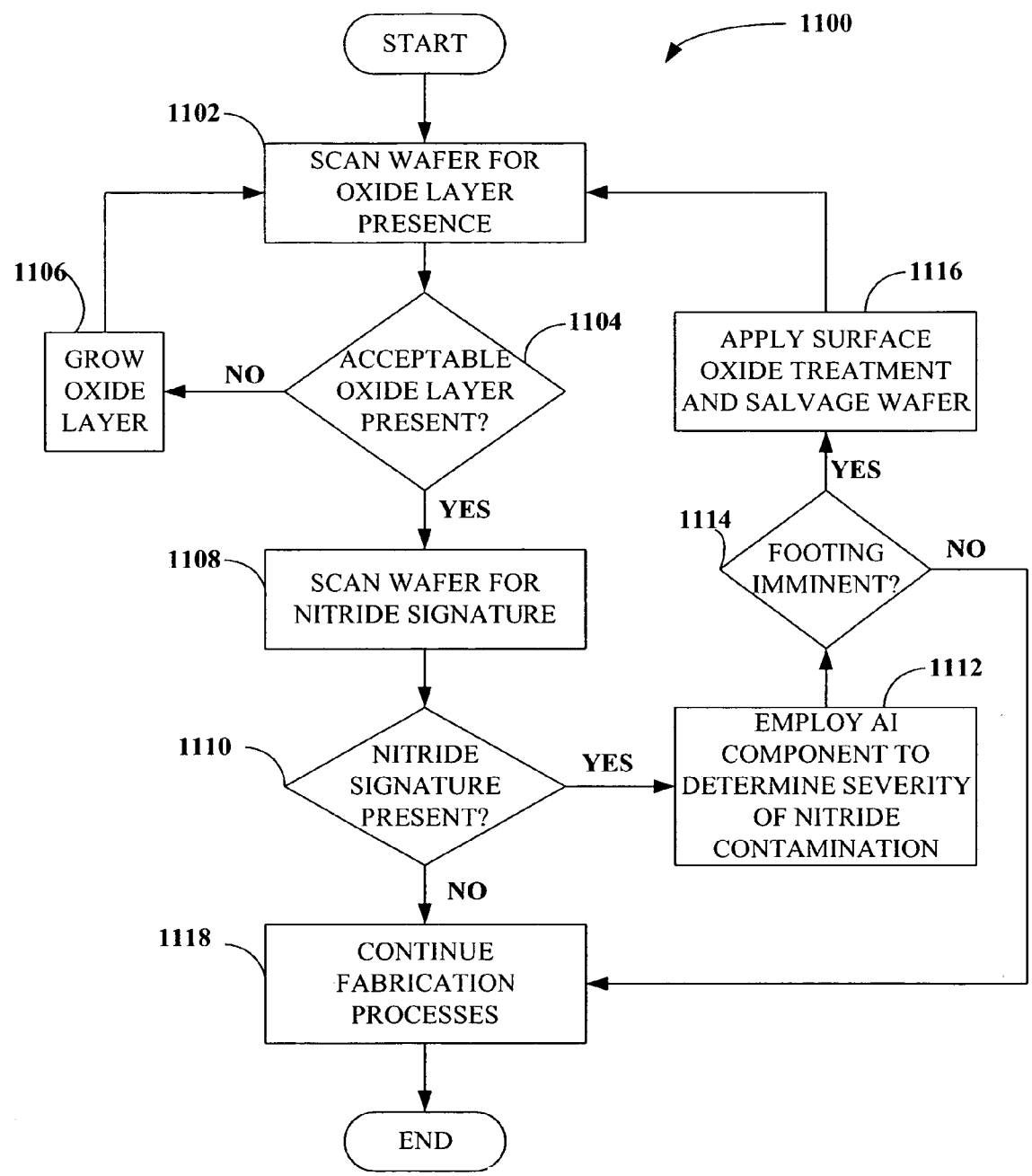
FIG. 11 is an illustration of a methodology that facilitates a correct determination regarding taking compensatory measures during production of a wafer.
Figure 12:
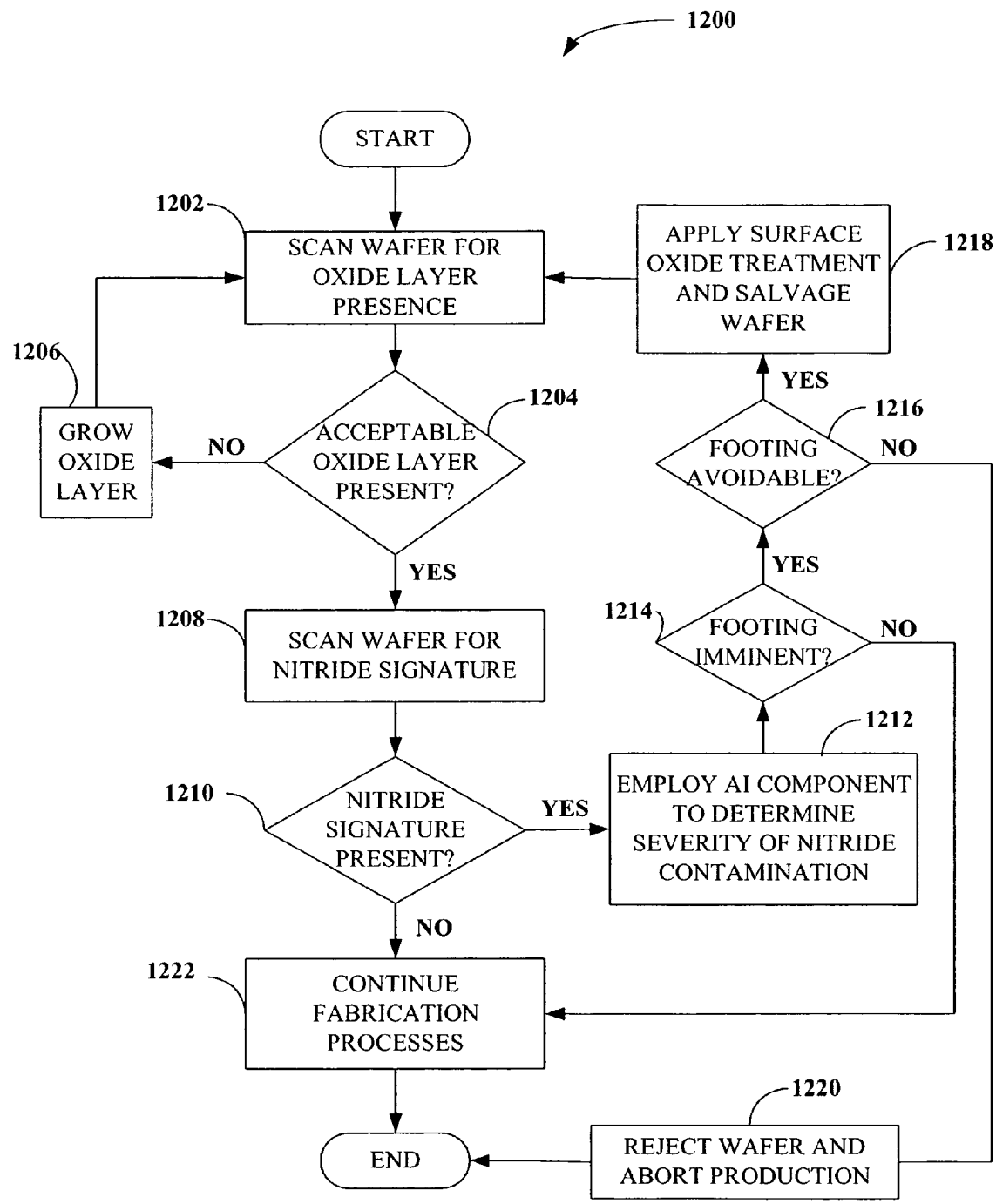
FIG. 12 is an illustration of a methodology that facilitates a correct determination regarding compensating for deficiencies in a wafer during production of a wafer.

Turning briefly to FIGS. 10, 11, and 12, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

FIG. 10 is an illustration of a methodology 1000 in accordance with an aspect of the present invention wherein a feedback and/or feedforward loops are employed to facilitate correcting wafer deficiencies upon detection. The methodology 1000 can take into account, for example, the presence and/or adequacy of an oxide layer on the wafer, the presence and/or magnitude of nitride signatures on the surface of the wafer, etc. At 1002, the wafer is scanned to determine whether an oxide layer is present on the wafer.

Scanning can be performed via employing, for example, an ellipsometry component. The present invention contemplates any suitable ellipsometry component and/or system, and such systems are intended to fall within the scope of the hereto-appended claims.

At 1004, a determination is made as to the presence of an oxide layer based, at least in part, on information gleaned during scanning of the wafer at 1002. Additionally, the adequacy of the oxide layer, if present, can be determined. For example, because typical oxide layers are very thin, it is possible that an oxide layer can be deposited in a non-uniform manner. A lack of uniformity in the oxide layer can result in an inadequate oxide layer thickness and/or an absence of oxide in one or more regions of a wafer. It is desirable to have an oxide layer thickness of at least approximately 30 angstroms, and preferably a thickness of between 30 and 50 angstroms. If it is determined that no oxide layer is present at 1004, then an oxide layer can be grown at 1006. Similarly, if it is determined at 1004 that an oxide layer is present, then the thickness of the oxide layer is assessed at 1008. If it is determined that the oxide layer is inadequate (e.g., less than 30 angstroms thick), or detrimentally non-uniform, then the methodology can proceed to 1006. Once an oxide layer has been grown on the wafer, the methodology 1000 can revert to 1002. If an oxide layer is present and sufficiently thick at 1008, then the wafer is scanned for nitride signatures at 1010. If, at 1012, it is determined that nitride signature(s) exist, then the wafer can be subjected to an oxide plasma treatment at 1014, in order to reduce the potentially deleterious effects of the nitride signature(s). Upon completion of the plasma treatment, the method returns to 1002. If no nitride signature is detected at 1012, then a deposition of a photoresist can occur at 1016. Finally, lithography process(es) continue at 1018.

FIG. 11 is an illustration of a methodology 1100 in accordance with an aspect of the present invention similar to the methodology 1000 described immediately supra. At 1102, a wafer is scanned to determine the presence and/or adequacy of an oxide layer. The scan can be performed via employing a phase and intensity technique, such as ellipsometry, for example. At 11104, a determination is made with regard to whether an oxide layer is present and/or adequate based on information gathered during the scan of the wafer. According to the present methodology, if no oxide layer is present, or if an oxide layer is present but insufficiently thick in one or more areas of the wafer, then an oxide can be grown on the wafer at 1106, after which the method can return to 1102. If an adequate oxide layer is determined to be present at 1104, then the wafer is scanned at 1108 for nitride signatures. For example, an optical technique such as FTIR can be employed to detect the presence of nitrogen signatures. At 1110, a determination is made as to the existence of nitride signatures based on information gathered during the scan at 1108. If no nitride signatures are detected at 1110, then the fabrication of the wafer can continue at 1118. If nitride signatures are present at 1110, then the method proceeds to 1112, where AI can be employed to determine the severity of the nitride presence. For example, a nitrogen signature having a magnitude below a predetermined tolerance can potentially be disregarded, such that no appreciable amount of footing would be caused thereby. In such a case, fabrication can continue without corrective action. If the magnitude of the nitrogen presence is greater than an acceptable tolerance, then a determination can be made that footing is imminent at 1114. Upon this determination, a surface oxide treatment can be applied to the wafer at 1116 to compensate for the potentially deleterious effects of the nitride signature by depositing an oxide layer that has a thickness of at least 30 angstroms. The method can then return to 1102. If it is determined at 1114 that the potential for a footing occurrence is small or absent, then the system can proceed to 1118, where the fabrication process continues as normal.

FIG. 12 is an illustration of a methodology 1200 in accordance with an aspect of the present invention. At 1202, a wafer is scanned to gather information pertaining to the presence of an oxide layer on the wafer. The scan can be performed via employing, for example, an optical technique such as ellipsometry. At 1204, a determination is made as to the presence and/or adequacy of an oxide layer based, at least in part, on information gathered during scanning of the wafer at 1202. If an oxide layer is not present on the wafer, or is present but not sufficiently uniform, then an oxide layer can be grown at 1206. An inadequate oxide layer is an oxide layer having a thickness less than approximately 30 angstroms in one or more regions of the wafer. If a sufficiently thick and uniform oxide layer is present on the wafer, then the wafer can be scanned for nitride signatures at 1208. The scan for nitride presence can be performed via, for example, FTIR spectroscopy.

At 1210, a determination is made regarding the presence of nitride signatures based, at least in part, on information gathered during the scan at 1208. If nitride signatures are present, then at 1212, AI is employed to determine the severity of nitride contamination of the oxide layer surface. Inferences can be made regarding the potentiality of footing occurrences based on, for example, data associated with previous footing occurrences, nitride concentration ratios, information stored in a database pertaining to previous and/or predicted nitride signature tolerances, etc. At 1214, a determination is made as to whether footing is imminent on the surface of the oxide layer. If footing is not imminent, then the method proceeds to 1222, where the fabrication process can continue without further corrective action.

Additionally, if footing is imminent, AI can be employed to predict whether the nitride signatures can be mitigated and/or whether an attempt to mitigate a potential footing episode is cost-effective at 1216. If, for example, the nitride presence is so severe that it cannot be corrected, then the wafer can be rejected at 1220, and further production costs associated therewith can be saved. However, if the magnitude of the nitride presence suggests that footing can be mitigated, then corrective action can be taken (e.g., surface oxide plasma treatment, etc.) at 1218. The method can then return to 1202. Such determinations can be made, for example, via an algorithm that dictates a maximum acceptable cost for repairing a wafer to an acceptable condition, such that if the predicted cost of repairing the wafer exceeds the maximum acceptable cost, the wafer will be rejected. Furthermore, the maximum acceptable cost can be predetermined or can be based on mitigating factors, such as, for instance, costs already invested in the production of the given wafer, time constraints, etc. If, at 1214, it is determined that footing is not imminent (e.g., the nitride signature is negligible), then fabrication processes can resume at 1222.

It is to be appreciated that discussion herein pertaining to the employment of AI in connection with facilitating a most correct decision to proceed with, or abort, production of a wafer is intended to encompass any and/or all determinations made in connection therewith. By way of example, and not limitation, AI can be employed in methodologies 1000, 1100, and/or 1200, to facilitate a determination of whether an extant oxide layer is sufficiently uniform, sufficiently thick, etc., and if not, whether the wafer should be subjected to corrective measures or rejected, etc.

Figure 13:
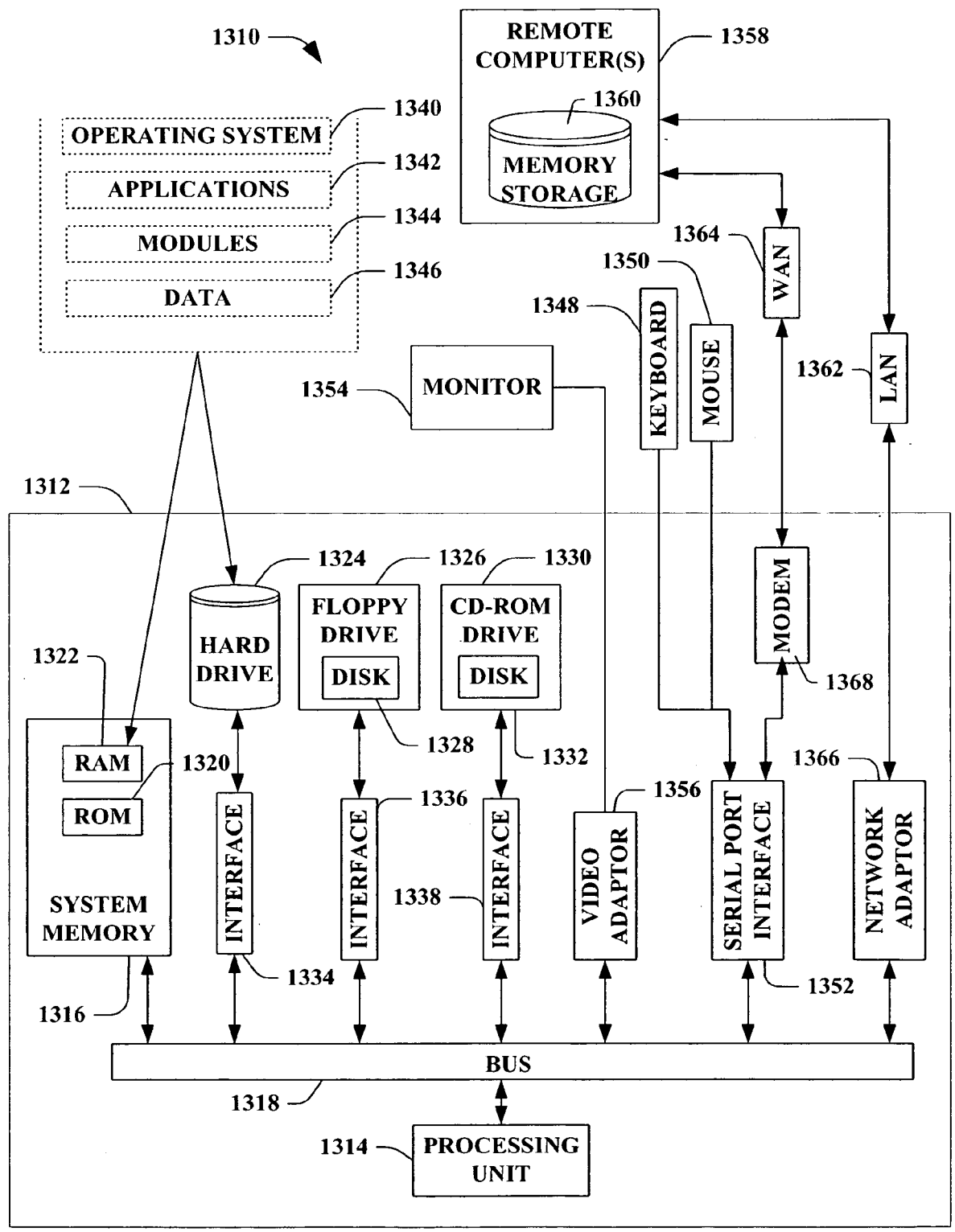
FIGS. 13 and 14 illustrate exemplary computing systems and/or environments in connection with facilitating employment of the subject invention.
Figure 14:
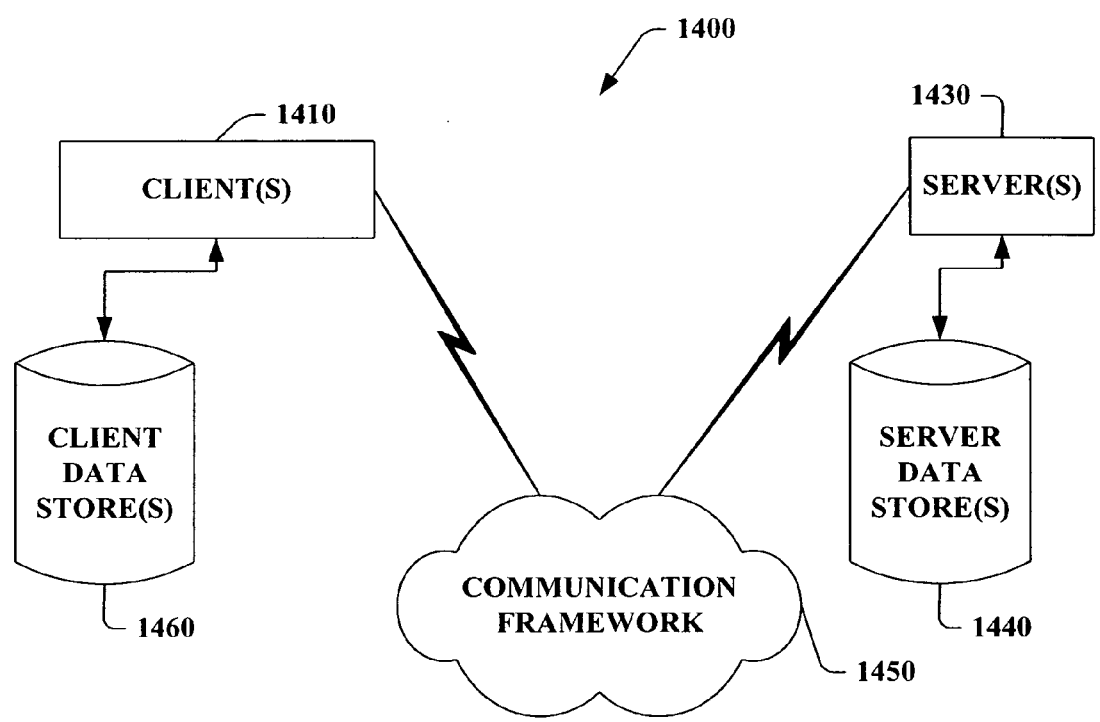

In order to provide a context for the various aspects of the invention, FIGS. 13 and 14 as well as the following discussion are intended to provide a brief, general description of a suitable computing environment in which the various aspects of the present invention can be implemented. While the invention has been described above in the general context of computer-executable instructions of a computer program that runs on a computer and/or computers, those skilled in the art will recognize that the invention also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the invention can also be practiced in distributed computing environments where tasks are performed by remote processing devices that are linked through a communications network. However, some, if not all, aspects of the invention can be practiced on stand-alone computers. In a distributed computing environment, program modules can be located in both local and remote memory storage devices.

With reference to FIG. 13, an exemplary environment 1310 for implementing various aspects of the invention includes a computer 1312. The computer 1312 includes a processing unit 1314, a system memory 1316, and a system bus 1318. The system bus 1318 couples system components including, but not limited to, the system memory 1316 to the processing unit 1314. The processing unit 1314 can be any of various available processors. Dual microprocessors and other multiprocessor architectures also can be employed as the processing unit 1314.

The system bus 1318 can be any of several types of bus structure(s) including the memory bus or memory controller, a peripheral bus or external bus, and/or a local bus utilizing any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1316 includes volatile memory 1320 and nonvolatile memory 1322. The basic input/output system (BIOS), comprising the basic routines to transfer information between elements within the computer 1312, such as during start-up, is stored in nonvolatile memory 1322. By way of illustration, and not limitation, nonvolatile memory 1322 can include read only memory (ROM), programmable ROM (PROM), electrically programmable ROM (EPROM), electrically erasable ROM (EEPROM), or flash memory. Volatile memory 1320 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1312 also includes removable/non-removable, volatile/non-volatile computer storage media. FIG. 13 illustrates, for example a disk storage 1324. Disk storage 1324 includes, but is not limited to, devices like a magnetic disk drive, floppy disk drive, tape drive, Jaz drive, Zip drive, LS-100 drive, flash memory card, or memory stick. In addition, disk storage 1324 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1324 to the system bus 1318, a removable or non-removable interface is typically used such as interface 1326.

It is to be appreciated that FIG. 13 describes software that acts as an intermediary between users and the basic computer resources described in suitable operating environment 1310. Such software includes an operating system 1328. Operating system 1328, which can be stored on disk storage 1324, acts to control and allocate resources of the computer system 1312. System applications 1330 take advantage of the management of resources by operating system 1328 through program modules 1332 and program data 1334 stored either in system memory 1316 or on disk storage 1324. It is to be appreciated that the present invention can be implemented with various operating systems or combinations of operating systems.

A user enters commands or information into the computer 1312 through input device(s) 1336. Input devices 1336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1314 through the system bus 1318 via interface port(s) 1338. Interface port(s) 1338 include, for example, a serial port, a parallel port, a game port, and a universal serial bus (USB). Output device(s) 1340 use some of the same type of ports as input device(s) 1336. Thus, for example, a USB port can be used to provide input to computer 1312, and to output information from computer 1312 to an output device 1340. Output adapter 1342 is provided to illustrate that there are some output devices 1340 like monitors, speakers, and printers, among other output devices 1340, which require special adapters. The output adapters 1342 include, by way of illustration and not limitation, video and sound cards that provide a means of connection between the output device 1340 and the system bus 1318. It should be noted that other devices and/or systems of devices provide both input and output capabilities such as remote computer(s) 1344.

Computer 1312 can operate in a networked environment utilizing logical connections to one or more remote computers, such as remote computer(s) 1344. The remote computer(s) 1344 can be a personal computer, a server, a router, a network PC, a workstation, a microprocessor based appliance, a peer device or other common network node and the like, and typically includes many or all of the elements described relative to computer 1312. For purposes of brevity, only a memory storage device 1346 is illustrated with remote computer(s) 1344. Remote computer(s) 1344 is logically connected to computer 1312 through a network interface 1348 and then physically connected via communication connection 1350. Network interface 1348 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1350 refers to the hardware/software employed to connect the network interface 1348 to the bus 1318. While communication connection 1350 is shown for illustrative clarity inside computer 1312, it can also be external to computer 1312. The hardware/software necessary for connection to the network interface 1348 includes, for exemplary purposes only, internal and external technologies such as, modems including regular telephone grade modems, cable modems and DSL modems, ISDN adapters, and Ethernet cards.

FIG. 14 is a schematic block diagram of a sample-computing environment 1400 with which the present invention can interact. The system 1400 includes one or more client(s) 1410. The client(s) 1410 can be hardware and/or software (e.g., threads, processes, computing devices). The system 1400 also includes one or more server(s) 1430. The server(s) 1430 can also be hardware and/or software (e.g., threads, processes, computing devices). The servers 1430 can house threads to perform transformations by employing the present invention, for example. One possible communication between a client 1410 and a server 1430 can be in the form of a data packet adapted to be transmitted between two or more computer processes. The system 1400 includes a communication framework 1450 that can be employed to facilitate communications between the client(s) 1410 and the server(s) 1430. The client(s) 1410 are operably connected to one or more client data store(s) 1460 that can be employed to store information local to the client(s) 1410. Similarly, the server(s) 1430 are operably connected to one or more server data store(s) 1440 that can be employed to store information local to the servers 1430.

What has been described above includes examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method that reduces production costs based on a determination of whether to adjust production parameters of a wafer, comprising:
    ascertaining whether a sufficiently thick and a sufficiently uniform oxide layer is present on the surface of a wafer, the sufficiently uniform oxide layer is an oxide layer that has a thickness between about 30 Angstroms and about 50 Angstroms;
    growing an oxide layer on the wafer if the oxide layer is insufficiently uniform or insufficiently thick; and
    approving the wafer if a sufficient oxide layer is present, a sufficient oxide layer is an oxide layer that is sufficiently thick and sufficiently uniform.

2. The method of claim 1, the oxide layer has a minimum sufficient thickness of about 30 Angstroms.

3. The method of claim 2, further comprising determining the status of the oxide layer via analyzing information associated with at least one of oxide layer thickness and oxide layer uniformity.

4. The method of claim 3, further comprising comparing the determined status of the oxide layer to at least one predetermined status tolerance.

5. The method of claim 4, the at least one predetermined status tolerance is stored in a memory.

6. The method of claim 4, further comprising growing an oxide layer on the wafer if the status of the oxide layer is below at least one predetermined tolerance.

7. The method of claim 4, further comprising making inferences regarding whether the status of the oxide layer can be improved at a cost below a predetermined maximum acceptable cost.

8. The method of claim 7, further comprising aborting production of the wafer if the inferences indicate that the cost of improving the status of the oxide layer exceeds the predetermined maximum acceptable cost.

9. The method of claim 2, further comprising scanning the oxide layer for at least one nitrogen signature.

10. The method of claim 9, further comprising determining whether at least one nitrogen signature is present in the oxide layer.

11. The method of claim 10, further comprising making inferences regarding a probability of successful treatment of the at least one nitrogen signature.

12. The method of claim 11, further comprising aborting production of the wafer if the inferences indicate that successful treatment of the wafer is unlikely.

13. The method of claim 9, further comprising applying a surface oxide plasma treatment to the wafer if at least one nitrogen signature is detected.

14. The method of claim 13, further comprising determining whether the surface oxide plasma treatment is effective.

15. The method of claim 9, further comprising determining the magnitude of the at least one nitrogen signature.

16. The method of claim 15, further comprising determining the probability of an occurrence of footing based at least in part on the magnitude of the at least one nitrogen signature.

17. The method of claim 16, further comprising applying a surface oxide treatment to the wafer if the probability of a footing occurrence is higher than a predetermined threshold probability value.

18. The method of claim 1, further comprising mapping the surface of the wafer into a grid having a plurality of regions.

19. The method of claim 18, further comprising determining the status of the oxide layer in at least one region of the surface of the wafer, if an oxide layer is present.

20. The method of claim 19, further comprising growing an oxide layer on the wafer if the status of the oxide layer is below a predetermined tolerance in the at least one region of the wafer.

21. The method of claim 19, further comprising determining whether at least one nitrogen signature is present in the at least one region of the oxide layer.

22. The method of claim 21, further comprising applying a surface oxide treatment to the wafer if at least one nitrogen signature is present in the at least one region of the oxide layer.

23. The method of claim 21, further comprising determining the magnitude of the at least one nitrogen signature.

24. The method of claim 23, further comprising determining whether to abort production of the wafer or take corrective action based at least in part on the magnitude of the at least one nitrogen signature.

25. A method that increases cost savings in wafer production via early-stage detection and selective correction of potential defect conditions, comprising:

means for ensuring a sufficiently thick oxide layer is present on a wafer surface, the sufficiently thick oxide layer is between about 30 Angstroms and about 50 Angstroms;

means for detecting nitrogen contamination expressed in the surface of an extant oxide layer; and means for facilitating a cost-effective decision regarding initiating corrective treatment of the wafer based at least in part on information obtained by the means for detecting an oxide layer and the means for detecting nitrogen contamination.

26. The method of claim 25, further comprising means for determining the status of the oxide layer.

27. The method of claim 26, further comprising means for repairing an oxide layer that exhibits characteristics that deviate from a predetermined threshold value associated with at least one of:

oxide layer thickness;

oxide layer uniformity;

nitrogen signature presence; and nitrogen signature magnitude.

28. The method of claim 27, further comprising means for determining whether the cost of repairing the oxide layer exceeds a predetermined maximum acceptable cost.

29. A methodology that selectively augments wafer production, comprising:

analyzing an extant oxide layer on a wafer;

determining if the extant oxide layer is sufficiently uniform, a sufficiently uniform oxide layer is an oxide layer that is between about 30 Angstroms and about 50 Angstroms;

growing the sufficiently uniform oxide layer on the wafer if the extant oxide layer is not sufficiently uniform;

inferring whether footing is likely to occur at a photoresist layer of the extant oxide layer; and inferring whether it is cost-effective to treat the wafer in order to mitigate the footing.

30. The method of claim 29, the footing inference is based at least in part upon a nitride contamination.

31. The method of claim 30, the cost-effective inference is based at least in part upon the level of the nitride contamination.

32. The method of claim 29, the cost-effective inference is based at least in part upon a production rate.

33. The method of claim 29, the cost-effective inference is a probability-based analysis.

* * * * *